(12) United States Patent
Leobandung

(10) Patent No.: US 9,837,453 B1
(45) Date of Patent: Dec. 5, 2017

(54) SELF-SUFFICIENT CHIP WITH PHOTOVOLTAIC POWER SUPPLY ON BACK OF WAFER

(71) Applicant: International Business Machines Corporation, Armonk, NY (US)

(72) Inventor: Effendi Leobandung, Stormville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/260,642

(22) Filed: Sep. 9, 2016

(51) Int. Cl.
| | |
|---|---|
| *H01L 27/142* | (2014.01) |
| *H01L 23/48* | (2006.01) |
| *H01L 31/068* | (2012.01) |
| *H01L 21/02* | (2006.01) |
| *H01L 21/48* | (2006.01) |

(52) U.S. Cl.
CPC ...... *H01L 27/142* (2013.01); *H01L 21/02063* (2013.01); *H01L 21/486* (2013.01); *H01L 23/481* (2013.01); *H01L 31/0682* (2013.01); *H01L 2225/06541* (2013.01)

(58) Field of Classification Search
CPC ............. H01L 21/02063; H01L 21/486; H01L 21/76804–21/76831; H01L 21/76877–21/76897; H01L 23/481; H01L 23/49827; H01L 23/5226; H01L 23/5384; H01L 29/4175; H01L 2225/06541–2225/06548; H01L 2225/107

USPC ................ 310/303; 257/774, 756, 773, 290; 438/19, 121, 637, 108; 365/154
See application file for complete search history.

(56) References Cited

U.S. PATENT DOCUMENTS

| | | | | |
|---|---|---|---|---|
| 7,390,700 | B2 * | 6/2008 | Gerber | H01L 21/4853 257/E21.499 |
| 8,921,967 | B2 | 12/2014 | Keysar et al. | |
| 9,006,851 | B2 * | 4/2015 | Regnier | H01L 25/16 257/433 |
| 9,189,654 | B2 * | 11/2015 | Feng | G06F 21/71 |
| 2005/0206576 | A1 * | 9/2005 | Gloria | H01Q 1/48 343/800 |
| 2006/0060238 | A1 * | 3/2006 | Hacke | H01L 31/068 136/256 |
| 2009/0050190 | A1 * | 2/2009 | Nishida | H01L 31/022433 136/244 |
| 2010/0148293 | A1 | 6/2010 | Jain et al. | |
| 2015/0028492 | A1 * | 1/2015 | Jung | H01L 27/10888 257/774 |
| 2016/0379729 | A1 * | 12/2016 | Roizin | G21H 1/06 310/303 |

* cited by examiner

*Primary Examiner* — Bo Fan
(74) *Attorney, Agent, or Firm* — Scully, Scott, Murphy & Presser, P.C.; Louis J. Percello, Esq.

(57) ABSTRACT

After forming a doped semiconductor layer on a backside of a semiconductor substrate that has a conductivity type opposite a conductivity type of the doped semiconductor layer so as to provide a p-n junction for a photovoltaic cell, transistors are formed in a front side of the semiconductor substrate. The photovoltaic cell is then electrically connected to the transistors from the front side of the semiconductor substrate using through-dielectric (TDV) via structures embedded in the semiconductor substrate.

10 Claims, 7 Drawing Sheets

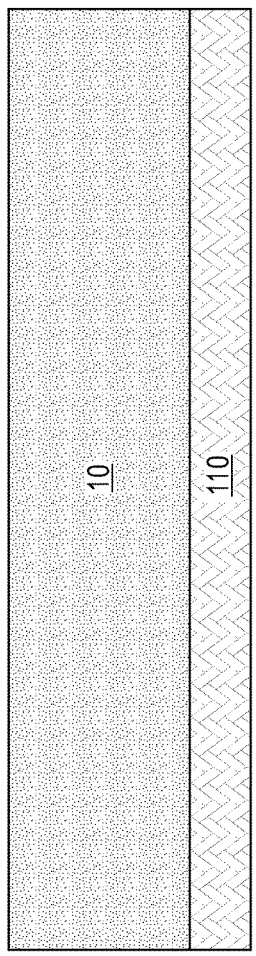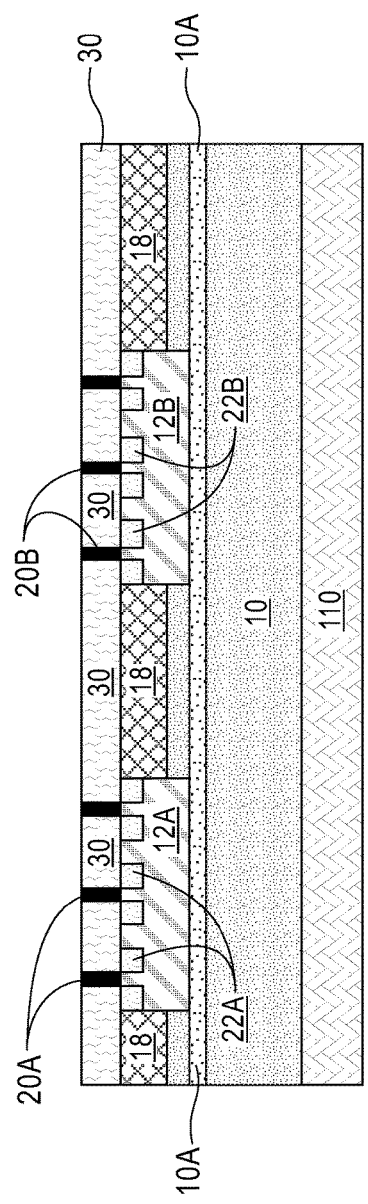

US 9,837,453 B1

SELF-SUFFICIENT CHIP WITH PHOTOVOLTAIC POWER SUPPLY ON BACK OF WAFER

BACKGROUND

The present application generally relates to integrated circuits, and particularly to semiconductor chips with photovoltaic cells integrated in the semiconductor chips.

Internet of Things (IoT) is an emerging technology, which combines different information sensing devices, such as radio frequency identifications (RFID), sensors, global positioning systems (GPS), and laser scanners, with internet to form a huge network. With the growth of the IoT, it is attractive to form self-powered semiconductor chips that do not require off-chip power supplies.

SUMMARY

The present application provides a method of forming a p-n junction photovoltaic cell on a backside of a semiconductor chip. The photovoltaic cell serves as a build-in power source for powering the semiconductor chip. After forming a doped semiconductor layer on the backside of a semiconductor substrate that has a conductivity type opposite a conductivity type of the doped semiconductor layer so as to provide a p-n junction for a photovoltaic cell, transistors are formed in a front side of the semiconductor substrate. The photovoltaic cell is then electrically connected to the transistors from the front side of the semiconductor substrate using through-dielectric (TDV) via or through-silicon-via (TSV) structures embedded in the semiconductor substrate.

According to an aspect of the present application, a semiconductor structure is provided. The semiconductor structure includes at least one transistor located in a front side of a semiconductor substrate of a first conductivity type. The at least one transistor is laterally surrounded by an interlevel dielectric (ILD) layer located over a topmost surface of the semiconductor substrate. The semiconductor structure also includes a doped semiconductor layer of a second conductivity type that is opposite to the first conductivity type located on a backside of the semiconductor substrate. A p-n junction is formed between the doped semiconductor layer and the semiconductor substrate. The semiconductor structure further includes a first stack including, from bottom to top, a first contact structure and a first dielectric cap located within a first trench that extends through the ILD layer and partially into the semiconductor substrate, and a second stack including, for bottom to top, a second contact structure and a second dielectric cap located within a second trench that extends through the ILD layer and the semiconductor substrate.

According to another aspect of the present application, a method of forming a semiconductor structure is provided. The method includes first forming a doped semiconductor layer on a backside of a semiconductor substrate. The semiconductor substrate is of a first conductivity type and the doped semiconductor layer is of a second conductivity type that is opposite to the first conductivity type. After forming at least one transistor in a front side of the semiconductor substrate, an ILD layer is formed laterally surrounding the at least one transistor. Next, a first stack including, from bottom to top, a first contact structure and a first dielectric cap is formed within a first trench that extends through the ILD layer and partially into the semiconductor substrate, and a second stack including, for bottom to top, a second contact structure and a second dielectric cap is formed within a second trench that extends through the ILD layer and the semiconductor substrate.

BRIEF DESCRIPTION OF THE SEVERAL VIEWS OF THE DRAWINGS

FIG. 1 is vertical cross-sectional view of an exemplary semiconductor structure after forming a doped semiconductor layer on a backside of a semiconductor substrate according to an embodiment of the present application.

FIG. 2 is a vertical cross-sectional view of the exemplary semiconductor structure of FIG. 1 after forming transistors in a front side of the semiconductor substrate and forming an interlevel dielectric (ILD) layer on a topmost surface of the semiconductor substrate to laterally surround the transistors.

DETAILED DESCRIPTION

Figure 3:
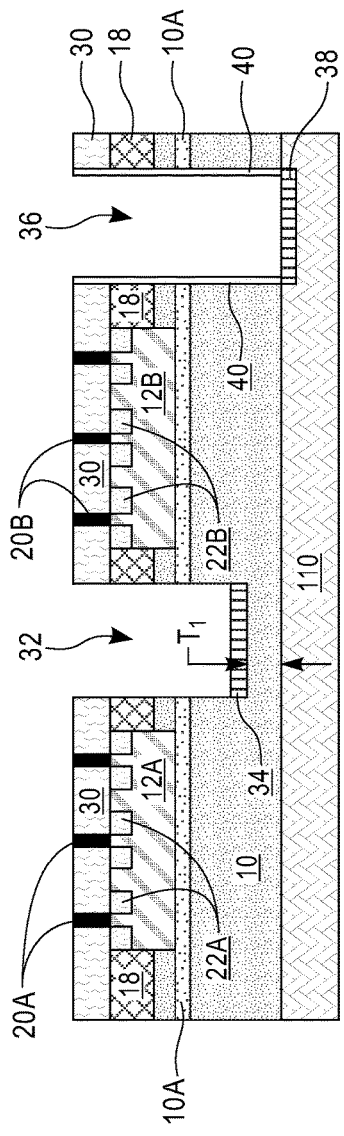
FIG. 3 is a vertical cross-sectional view of the exemplary semiconductor structure of FIG. 2 after forming a first heavily doped region beneath a bottom surface of a first trench that is formed extending through the ILD layer and into semiconductor substrate and forming a second heavily doped region beneath a bottom surface of a second trench that is formed extending through the ILD layer and semiconductor substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring to FIG. 1, an exemplary semiconductor structure according to an embodiment of the present application includes a semiconductor substrate 10 and a doped semiconductor layer 110 formed on a backside of the semiconductor substrate 10. The semiconductor substrate 10 includes a semiconductor material of a first conductivity type, which can be p-type or n-type. The doped semiconductor layer 110 includes a semiconductor material of a second conductivity type which is opposite to the first conductivity type. For example, if the first conductivity type is p-type, the second conductivity type is n-type, and vice versa. The semiconductor substrate 10 and the doped semiconductor layer 110 thus form a p-n junction for a photovoltaic cell. As used herein, the term "p-type" refers to the addition of impurities to an intrinsic semiconductor material that creates deficiencies of valence electrons. Examples of p-type dopants, i.e., impurities, include, but are not limited to, boron, aluminum, gallium and indium. The term "n-type" refers to the addition of impurities that contributes free electrons to an intrinsic semiconductor material. Examples of n-type dopants, i.e., impurities, include, but are not limited to, antimony, arsenic and phosphorous.

The semiconductor substrate 10 can be a bulk substrate including a bulk semiconductor material throughout, or a semiconductor-on-insulator (SOI) substrate (not shown) containing a top semiconductor layer, a buried insulator layer located under the top semiconductor layer, and a bottom semiconductor layer located under the buried insulator layer. The thickness of the semiconductor substrate 10 can be from 30 µm to about 2 mm, although lesser and greater thicknesses can also be employed.

The semiconductor substrate 10 includes a semiconductor material and dopants of the first conductivity type. The semiconductor material can be silicon, germanium, a silicon germanium alloy, a silicon carbon alloy, a silicon germanium carbon alloy, a IIV-V compound semiconductor material, a II-VI compound semiconductor material, or any other semiconductor material known in the art. The doped semiconductor layer 110 includes a semiconductor material and dopants of the second conductivity type. The semiconductor material that provides the doped semiconductor layer 110 can be the same as, or different from, the semiconductor material that provides the semiconductor substrate 10. The semiconductor materials of the semiconductor substrate 10 and the doped semiconductor layer 110 can be independently single crystalline, polycrystalline, and/or amorphous. In one embodiment, each of the semiconductor substrate 10 and the doped semiconductor layer 110 is comprised of a single crystalline semiconductor material such as, for example, single crystalline silicon. In one embodiment, the semiconductor substrate 10 includes p-type dopants and the doped semiconductor layer 100 includes n-type dopants. The dopant concentration in the semiconductor substrate 10 can be less than $1\times10^{16}$ atoms/cm$^3$, while the dopant concentration in the doped semiconductor layer 110 can be from $1\times10^{16}$ atoms/cm$^3$ to $1\times10^{19}$ atoms/cm$^3$, although lesser and greater dopant concentrations can also be employed.

The doped semiconductor layer 110 can be formed by implanting dopants of the second conductivity into a bottom portion of the semiconductor substrate 10 by ion implantation, or by other doping techniques, such as solid-state diffusion from a doping layer, a vapor or plasma-generated ions. Alternatively, the doped semiconductor layer 110 can be formed by epitaxially growing a semiconductor material. When an epitaxial growth process is employed, the doped semiconductor layer 110 is epitaxially aligned with the underlying surface of the semiconductor substrate 10. By "epitaxially aligned" it is meant that the doped semiconductor layer 110 has a same crystal orientation as that of the underlying semiconductor substrate 10. The semiconductor material that provides the doped semiconductor layer 110 can be deposited as an intrinsic semiconductor material, or can be deposited with in-situ doping. If the semiconductor material is deposited as an intrinsic semiconductor material, the semiconductor layer as deposited can be subsequently doped (ex-situ) utilizing ion implantation, gas phase doping or dopant out diffusion from a sacrificial dopant source material to form the doped semiconductor layer 110. The thickness of the doped semiconductor layer 110 can be from 10 nm to 1 µm, although lesser and greater thicknesses can also be employed.

Referring to FIG. 2, semiconductor devices are formed in a front side of the semiconductor substrate 10. In one embodiment and as shown, the semiconductor devices are filed effect transistors (FETs) formed using typical advanced complementary metal oxide semiconductor (CMOS) integrated circuit fabrication processes including for example, any gate first or gate last process.

In one embodiment, various portions of the semiconductor substrate 10 can be doped with dopants of n-type or p-type at different dopant concentration levels to provide doped wells (12A, 12B). For example, the semiconductor substrate 10 may include a first doped well 12A formed in a first device region, and a second doped well 12B formed in a second device region. Each of the first doped well 12A and the second doped well 12B can be independently doped with n-type dopants or p-type electrical dopants. Thus, each of the first doped well 12A and the second doped well 12B can be an n-type well or a p-type well.

A shallow trench isolation (STI) structure 18 can be formed to laterally separate each of the first doped well 12A and the second doped well 12B. Typically, each of the first doped well 12A and the second doped well 12B is laterally surrounded by the STI structure 18. If the semiconductor substrate is an SOI substrate, bottom surfaces of the first doped well 12A and the second doped well 12B may contact the buried insulator layer (not shown), which electrically isolates each of the first doped well 12A and the second doped well 12B from other semiconductor portions of the semiconductor substrate 10 in conjunction with the STI structure 18. Alternatively, the semiconductor substrate 10 can be isolated from the first and second doped wells 12A, 12B by forming a junction isolation layer 10A between the first and second doped wells 12A, 12B and semiconductor substrate 10. The junction isolation layer 10A has an conductivity type opposite to that of the semiconductor substrate 10, thus forming a p-n junction with the semiconductor substrate 10.

First gate structures 20A are formed over the first doped well 12A, and second gate structures 20B are formed over the second doped well 12B. Each of the first gate structures 20A and the second gate structures 20B may include a gate stack and a gate spacer formed on sidewalls of the gate stack. In one embodiment, each gate stack may include, from bottom to top, a gate dielectric, a gate electrode and a gate cap. The gate stacks may be formed by deposition and patterning of gate stack layers. The patterning of the gate stack layers can be effected by application of a photoresist layer (not shown), lithographic patterning of the photoresist layer, transfer of the pattern in the photoresist layer into the gate stack layers, and removal of the patterned photoresist layer, for example, by ashing. In one embodiment, the materials of the gate stacks can be sacrificial materials that are subsequently removed, and are replaced with functional gate stacks including functional gate dielectrics and functional gate electrodes after formation of source and drain regions for FETs.

The gate dielectric can include silicon oxide, silicon nitride, silicon oxynitride, or a combination thereof. Alternately or additionally, the gate dielectric can include a high dielectric constant (high-k) dielectric material having a dielectric constant greater than 8.0. Exemplary high-k dielectric materials include, but are not limited to, $HfO_2$, $ZrO_2$, $La2O_3$, $Al_2O_3$, $TiO_2$, $SrTiO_3$, $LaAlO_3$ or $Y_2O_3$. The gate dielectric can have a thickness from 1 nm to 10 nm, although lesser and greater thicknesses can also be employed.

The gate electrode can include a conductive material. Conductive materials that can be employed for the gate electrode include, but are not limited to, doped semiconductor materials such as, for example, doped polysilicon and metallic materials such as, for example, tungsten, titanium, tantalum, aluminum, nickel, ruthenium, palladium, platinum, or alloys thereof. The gate electrode can have a thickness from 10 nm to 100 nm, although lesser and greater thicknesses can also be employed.

The gate cap can include a dielectric material such as, for example, silicon oxide, silicon nitride or silicon oxynitride. The gate cap can have a thickness from 20 to 100 nm, although lesser and greater thicknesses can also be employed.

The gate spacers can include silicon oxide, silicon nitride, silicon oxynitride, or combinations thereof. The gate spacers can be formed, for example, by deposition of a conformal dielectric material layer and selective removal of horizontal portions of the deposited conformal dielectric material layer. The remaining vertical portions of the deposited conformal dielectric material layer constitute the gate spacers. The width of each gate spacer, as measured at the base, can be from 2 nm to 50 nm, although lesser and greater widths can also be employed.

First dopants are implanted into portions of the first doped well 12A that are not covered by the first gate structures 20A to form a first source region and a first drain region (collectively referred to as first source drain regions 22A) on opposite sides of each of the first gate structures 20A. The second doped well 12B can be masked by a photoresist layer (not shown) during the implantation of the first dopants to prevent implantation of the first dopants therein. In one embodiment, the first dopants have a conductivity type opposite to the conductivity type of the first doped well 12A. For example, the first doped well 12A can be a p-type well and the first dopants can be n-type dopants such as P, As, or Sb. Alternatively, the first doped well 12A can be an n-type well and the first dopants can be p-type dopants such as B, Ga, and In.

Similarly, second dopants are implanted into portions of the second doped well 12B that are not covered by the second gate structures 20B to form a second source region and a second drain region (collectively referred to as second source drain regions 22B) on opposite sides of each of the second gate structures 20B. The first doped well 12A can be masked by a photoresist layer (not shown) during the implantation of the second dopants to prevent implantation of the second dopants therein. In one embodiment, the second dopants have a conductivity type opposite to the conductivity type of the second doped well 12B. For example, the second doped well 12B can be an n-type well and the second dopants can be p-type dopants. Alternatively, the second doped well 12B can be a p-type well and the second dopants can be n-type dopants.

An interlevel dielectric (ILD) layer 30 is formed over the first and source/drain regions 22A, 22B and the STI structure 18. The ILD Layer 30 laterally surrounds the first and second gate structures 20A, 20B. In some embodiments of the present application, the ILD layer 30 is composed of a dielectric material that may be easily planarized. For example, the ILD layer 30 can include a doped silicate glass, an undoped silicate glass (silicon oxide), an organosilicate glass (OSG), a porous dielectric material, or amorphous carbon. The ILD layer 30 can be deposited using a conventional deposition process such as, for example, chemical vapor deposition (CVD), plasma enhanced chemical vapor deposition (PECVD) or spin coating. If the ILD layer 30 is not self-planarizing, and following the deposition of the ILD layer 30, the ILD layer 30 can be subsequently planarized, for example, by chemical mechanical planarization (CMP) using the topmost surfaces of the first and second gate structures 20A, 20B as an etch stop so that a top surface of the ILD layer 30 is coplanar with the topmost surfaces of the first and second gate structures 20A, 20B.

Referring to FIG. 3, a first trench 32 is formed extending through the ILD layer 32 and the STI structure 18 and partially into the semiconductor substrate 10. The first trench 32 exposes a sub-surface of the semiconductor substrate 10 which is located beneath the topmost surface of the semiconductor substrate 10. By "sub-surface" it is meant a surface of a material that is located between a topmost surface and a bottommost surface of the same material.

The first trench 32 can be formed by lithography and etching. Specifically, a blanket layer of a first photoresist material (not shown) is first applied on the top surface of the ILD layer 30 and lithographically patterned to form an opening therein. The pattern of the opening in the first photoresist layer is then transferred through the ILD layer 30 and the STI structure 18 and partially into the semiconductor substrate 10 employing at least one anisotropic etch to form the first trench 32. In some embodiments, the anisotropic etch can be a dry etch such as, for example, reactive ion etch (RIE). In other embodiments, the anisotropic etch may be a wet etch. After the etching process has been performed, the patterned first photoresist layer can be removed from the structure utilizing a conventional resist stripping process such as, for example, ashing.

A portion of the semiconductor substrate 10 that is exposed by the first trench 32 is doped to form a heavily doped region of the first conductivity type (herein referred to a first heavily doped region 34). The term "highly doped" is used herein to denote a doped region in which the dopant concentration in that region is greater than $1\times10^{19}$ atoms/$cm^3$. In one embodiment, the first heavily doped region 34 can be formed by implanting dopants of the first conductivity type into the semiconductor substrate 10 through the first trench 32. The first heavily doped region 34 thus formed is located below a bottom surface of the first trench 32 (i.e., the sub-surface of the semiconductor substrate 10), and has a conductivity type the same as that of the semiconductor substrate 10. After implantation, a remaining portion of the semiconductor substrate 10 that is located between the first heavily doped region 34 and the doped semiconductor layer 110 has a thickness $T_1$ about 500 μm.

A second trench 36 is formed extending through the ILD layer, the STI structure 18 and the semiconductor substrate 10. The second trench 36 exposes the doped semiconductor layer 110. The second trench 36 can be formed by lithography and etching. Specifically, a blanket layer of a second photoresist material is first applied on the top surface of the ILD layer 30 and lithographically patterned to form an opening therein. The pattern of the opening in the second photoresist layer is then transferred through the ILD layer 30, the STI structure 18 and the semiconductor substrate 10 employing at least one anisotropic etch to form the second trench 36. In some embodiments, the anisotropic etch can be a dry etch such as, for example, RIE. In other embodiments, the anisotropic etch may be a wet etch.

A portion of the doped semiconductor layer 110 that is exposed by the second trench 36 is doped to form a heavily doped region of the second conductivity type (herein referred to a second heavily doped region 38). In one embodiment, the second heavily doped region 36 can be formed by implanting dopants of the second conductivity type into the doped semiconductor layer 110 through the second trench 36. The second heavily doped region 36 thus formed is located below a bottom surface of the second trench 36, and has a conductivity type the same as that of the doped semiconductor layer 110.

After formation of the heavily doped regions 34, 38, dopants in the first and second heavily doped regions 34, 38 can be activated by annealing at elevated temperatures in the range of 500° C. to 900° C.

A dielectric liner 40 can be formed on sidewalls of the second trench 36. The dielectric liner 40 electrically isolates a contact structure subsequently formed within the second trench 36 from the semiconductor substrate 10. The dielectric liner 40 can include a dielectric material such as, for example, silicon dioxide, silicon nitride, silicon oxynitride, a dielectric metal oxide, a dielectric metal nitride, dielectric metal oxynitride, or a combination thereof. The dielectric liner 40 can be formed, for example, by a conformal deposition of a dielectric material layer (not shown), and by a subsequent anisotropic etch that removes horizontal portions of the deposited dielectric material layer. A remaining vertical portion of the conformal dielectric material layer within the second trench 36 constitutes the dielectric liner 50. The top surface of the dielectric liner 40 is coplanar with the top surface of the ILD layer 30.

After formation of the dielectric liner 40, the patterned second photoresist layer can be removed from the structure utilizing a conventional resist stripping process such as, for example, ashing.

It is noted that the order of forming the first trench 32 and the second trench 36 can vary. For example, the second trench 36, the second heavily doped region 38 and the dielectric liner 40 can be formed first, followed by the formation of the first trench 32 and the first heavily doped region 34.

Figure 4:
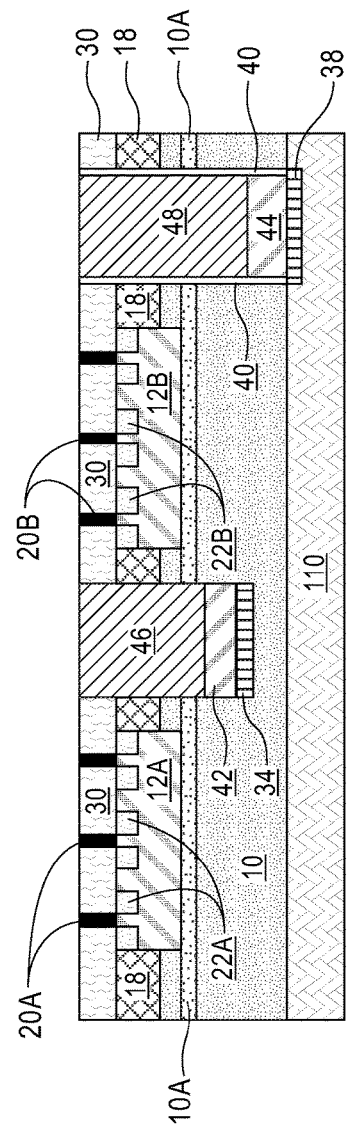
FIG. 4 is a vertical cross-sectional view of the exemplary semiconductor structure of FIG. 3 after forming a stack of a first contact structure and a first dielectric cap within the first trench and a stack of a second contact structure and a second dielectric cap within the second trench.

Referring to FIG. 4, a first contact structure 42 is formed within the first trench 32 contacting the first heavily doped region 34, while a second contact structure 44 is formed within the second trench 36 contacting the second heavily doped region 38. The first and second contact structures 42, 44 provide electrical connections for the p-n junction of the photovoltaic cell. The first and second contact structures 42, 44 can be formed by first depositing a conductive material to completely fill the first trench 32 and the second trench 36. The conductive material can be, for example, tungsten, copper, aluminum, silver, gold, platinum, or an alloy thereof. The conductive material can be deposited by electroplating, electroless plating, CVD, atomic layer deposition (ALD), or physical vapor deposition (PVD). Subsequently, the deposited conductive material can be planarized, for example, by CMP and recessed by a recess etch. The etch can be a dry etch or a wet etch that selectively removes the conductive material, without etching materials of other components in the structure. After recessing, the top surfaces of the first and second contact structures 42, 44 can be coplanar with, or below the topmost surface of the semiconductor substrate 10. In instances where the junction isolation layer 10A is present, the top surfaces of the first and second contact structures 42, 44 are located below the bottom surface of the junction isolation layer 10, thus the first and second contact structures 42, 44 do not contact the junction isolation layer 10A. In one embodiment, the thickness of each of the first and second contact structures 42, 44 can be 100 nm.

The remaining volumes of the first trench 32 and the second trench 36 are then filled with a dielectric fill material to form a first dielectric cap 46 atop the first contact structure 42 and a second dielectric cap 48 atop the second contact structure 44. The dielectric fill material can be, for example, silicon oxide, silicon oxynitride, or silicon nitride. The dielectric fill material can be deposited by CVD or PECVD. The excess material on the top surface of the ILD layer 30 can be removed, for example, CMP, a recess etch, or a combination thereof. The top surfaces of the first and second dielectric caps 46, 48 are coplanar with the top surface of the ILD layer 30.

Figure 5:
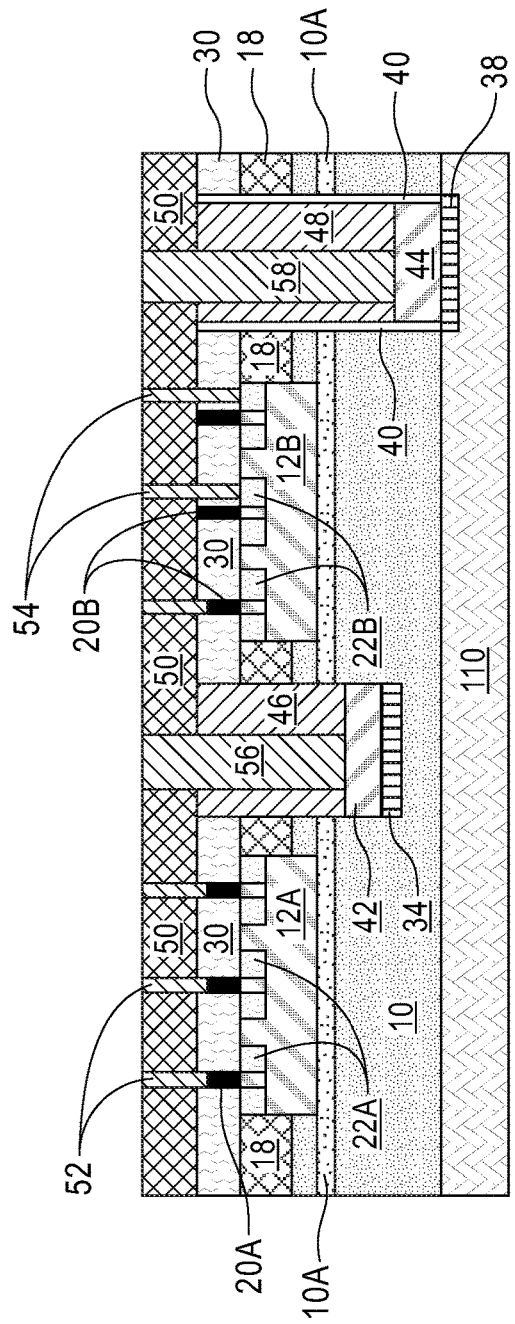
FIG. 5 is a vertical cross-sectional view of the exemplary semiconductor structure of FIG. 4 after forming local connect structures in a contact level dielectric layer formed over the ILD layer.

Referring to FIG. 5, a contact level dielectric layer 50 is formed over the ILD layer 30, the first and second gate structures 20A, 20B and the first and second dielectric caps 46, 48. The contact level dielectric layer 50 can include a dielectric material, which can be silicon dioxide, silicon nitride, or a low dielectric constant (low-k) material such as organosilicate glass. In some embodiments, the contact level dielectric layer 50 may include a dielectric material the same as the dielectric material of the ILD layer 30. The contact level dielectric layer 50 can be formed, for example, by CVD or spin coating. The contact level dielectric layer 50 can be self-planarizing, or the top surface of the contact level dielectric layer 50 can be planarized, for example, by CMP. In one embodiment, the planarized top surface of the contact level dielectric layer 50 is located above the top surface of the ILD layer 30.

Various local connect structures can be formed. The local connect structures include gate contact structures 52 extending through the contact level dielectric layer 50 and gate caps (not shown) to form contact with gate electrodes (not shown) of the gate structures 20A, 20B, source/drain contact structures 54 extending through the contact level dielectric layer 50 and the ILD layer 30 to form contact with the source/drain regions 22A, 22B, a first through-dielectric via (TDV) structure 56 extending through the contact level dielectric layer 50 and the first dielectric cap 46 to form contact with the first contact structure 42, and a second TDV structure 58 extending through the contact level dielectric layer 50 and the second dielectric cap 48 to form contact with the second contact structure 44. The local connect structures (52, 54, 56) can be formed by formation of contact openings (not shown) through the dielectric components (i.e., the contact level dielectric layer 50, the ILD layer 30, the first dielectric cap 46, and the second dielectric cap 48) utilizing a combination of lithographic patterning and anisotropic etch followed by deposition of a conductive material (e.g., copper or tungsten) and planarization that removes an excess portions of the conductive material from above the top surface of the contact level dielectric layer 50. Optionally, contact liners (not shown) may be formed on the sidewalls and bottoms surfaces of the contact openings before filling the contact openings with the conductive material. The contact liners may include TiN.

Figure 6:
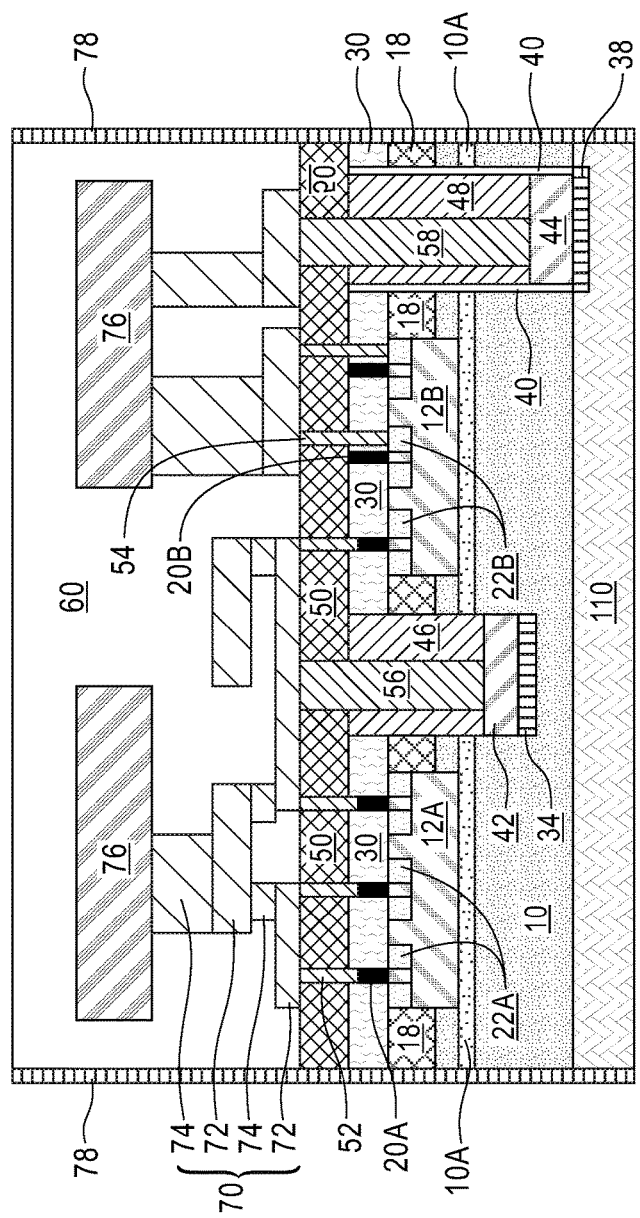
FIG. 6 is a vertical cross-sectional view of the exemplary semiconductor structure of FIG. 5 after forming interconnect structures in at least one dielectric material layer formed over the contact level dielectric layer.

Referring to FIG. 6, at least one dielectric material layer 60 is formed over the contact level dielectric layer 50, the gate contact structures 52, the source/drain contact structures and the first and second TDV structures 56, 58. The at least one dielectric material layer 60 can include at least one dielectric material, which can be a doped or undoped silicate glass, silicon nitride, or a low dielectric constant (low-k) material such as organosilicate glass. The at least one dielectric material layer 60 can include a plurality of dielectric material layers having different compositions. A total thickness of the at least one dielectric material layer 60 can be from 5 μm to 10 μm, although lesser and greater thicknesses can also be employed.

Interconnect structures 70 and antennas 76 are formed embedded within the at least one dielectric material layer 60. Each antenna 76 overlies one of the interconnect structures 70. Each of the interconnect structures 70 includes alternatively stacked conductive line structures 72 and conductive via structures 74. In one embodiment, the interconnect structures 70 and the antennas 76 can be formed, for example, by a dual damascene process known in the art. Each of the interconnect structures 70 and the antennas 76 may be composed a conductive material such as, for example, copper, aluminum, tungsten, silver, gold, or platinum. Alloys, such as copper-aluminum, can also be used. The antennas 76 are optional and can be omitted in some embodiments of the present application. Also an optional and additional C4 bump can be employed on top of the structure for C4 wire soldering. While in the present application the interconnect structures 70 are shown as a wiring configuration for a semiconductor integrated circuit, it is by no means limited to such wiring configuration as the interconnect structures 70 can be any wiring structure typically employed in the semiconductor integrated circuit.

Next, a guard ring 78 is formed along a periphery of the FETs, first and second contact structures 42, 44, local connect structures (52, 54, 56, 58) and interconnect structures 70 to laterally surround these components. The guard ring 78 extends through the at least one dielectric material layer 60, the contact level dielectric layer 50, the ILD layer 30, the STI structure 18, the semiconductor substrate 10 and the doped semiconductor layer 110. The guard ring 78 can include a dielectric oxide or a conductive metal and can be formed by processes known in the art.

Figure 7:
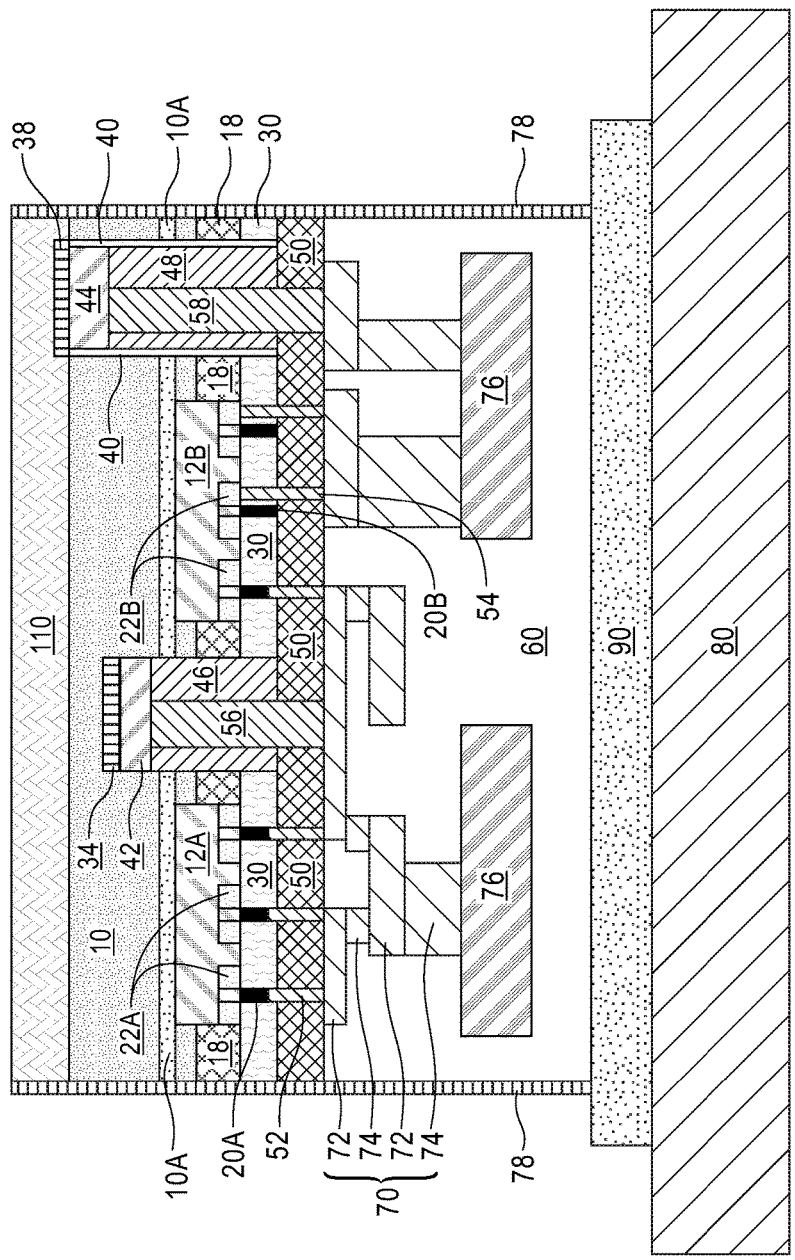
FIG. 7 is a vertical cross-sectional view after attaching the structure of FIG. 6 to a carrier substrate from the front side of the semiconductor substrate using a temporary chip attach (TCA) structure.

Referring to FIG. 7, the structure of FIG. 6 is flipped upside down so that a bottom surface of the doped semiconductor layer 110 that is distal from the semiconductor substrate 10 faces up. A carrier substrate 80 is then attached to the at least one dielectric material layer 60 which is at a bottom of the structure, for example, by a temporary chip attach (TCA) structure 90.

The carrier substrate 80 can be a glass substrate or a quartz substrate. The carrier substrate 80 may have a thickness from 500 μm to about 2000 μm, although lesser and greater thicknesses can also be employed.

The TCA structure 90 may be an adhesive layer composed of a non-conductive adhesive material. Examples of non-conductive adhesive materials include, but are not limited to, benzocyclobutene (BCB), polyarylene ether, polyimide, polymethylmethacrylaete (PMMA) and polydimethylsiloxane (PDMS). In one embodiment, the TCA structure 90 is composed of a thermally decomposable adhesive material that breaks down at elevated temperature.

Figure 8:
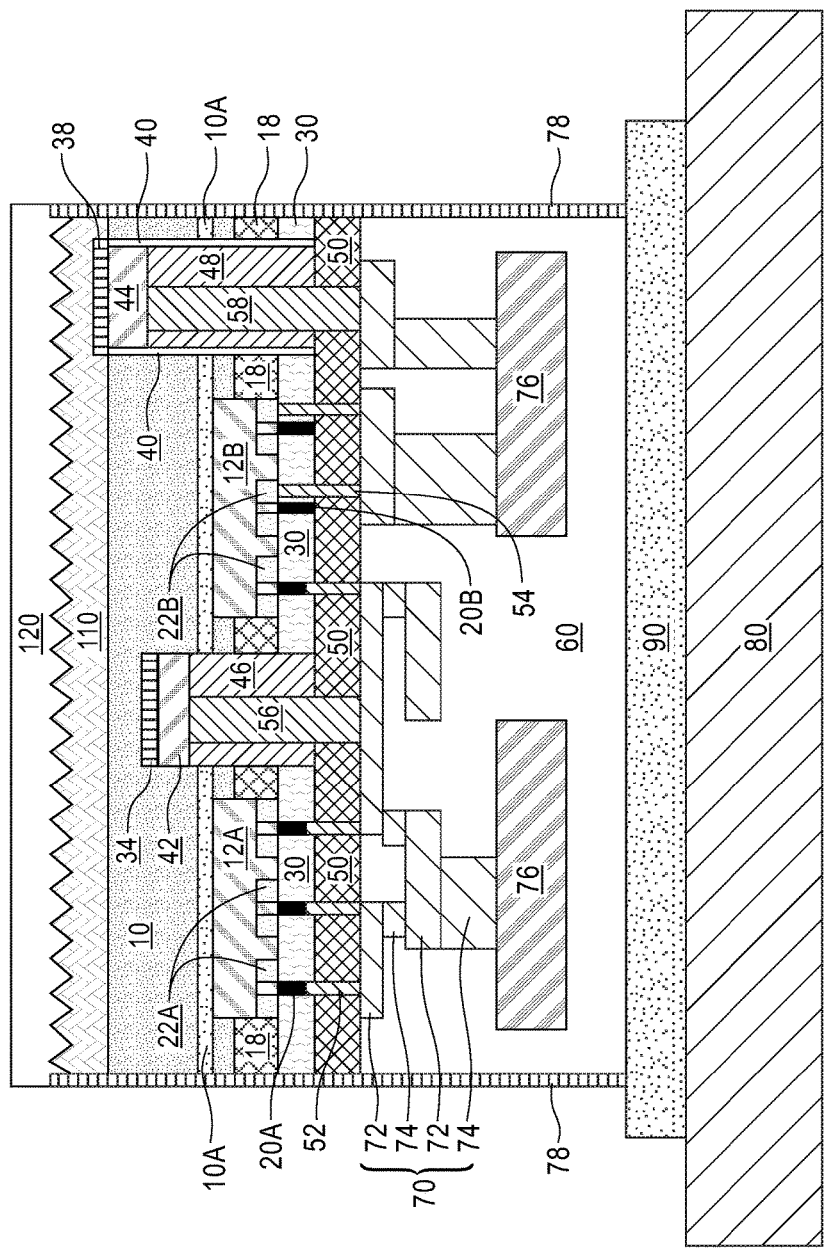
FIG. 8 is a vertical cross-sectional view of the exemplary semiconductor structure of FIG. 7 after forming a passivation layer on a bottom surface of the doped semiconductor layer.

Referring to FIG. 8, a passivation layer 120 is formed on the bottom surface of the doped semiconductor layer 110. The passivation layer can significantly reduce the density of surface carrier recombination, thus increasing efficiency of the photovoltaic cell. In some embodiments of the present application, the passivation layer 120 may also function as an anti-reflection layer to reduce reflection of the incident light. The passivation layer 120 may include silicon dioxide, silicon nitride or a metal oxide such as, for example, $Al_2O_3$, $HfO_2$ or ZnO. The passivation layer 120 can be deposited, for example, by CVD, PECVD or PVD. The thickness of the passivation layer 120 can be from 3 nm to 10 nm, although lesser or greater thicknesses can also be employed.

In some embodiments of the present application and as shown in FIG. 8, and before formation of the passivation layer 120, the bottom surface of the doped semiconductor layer 110 may be etched to form a texture surface for improving light coupling efficiency. For example, the doped semiconductor layer 110 may be immersed into a KOH solution to form a plurality of pyramidal microstructure on the bottom surface of the doped semiconductor layer 110. In another embodiment, the texture surface may be formed by a dry etch.

Figure 9:
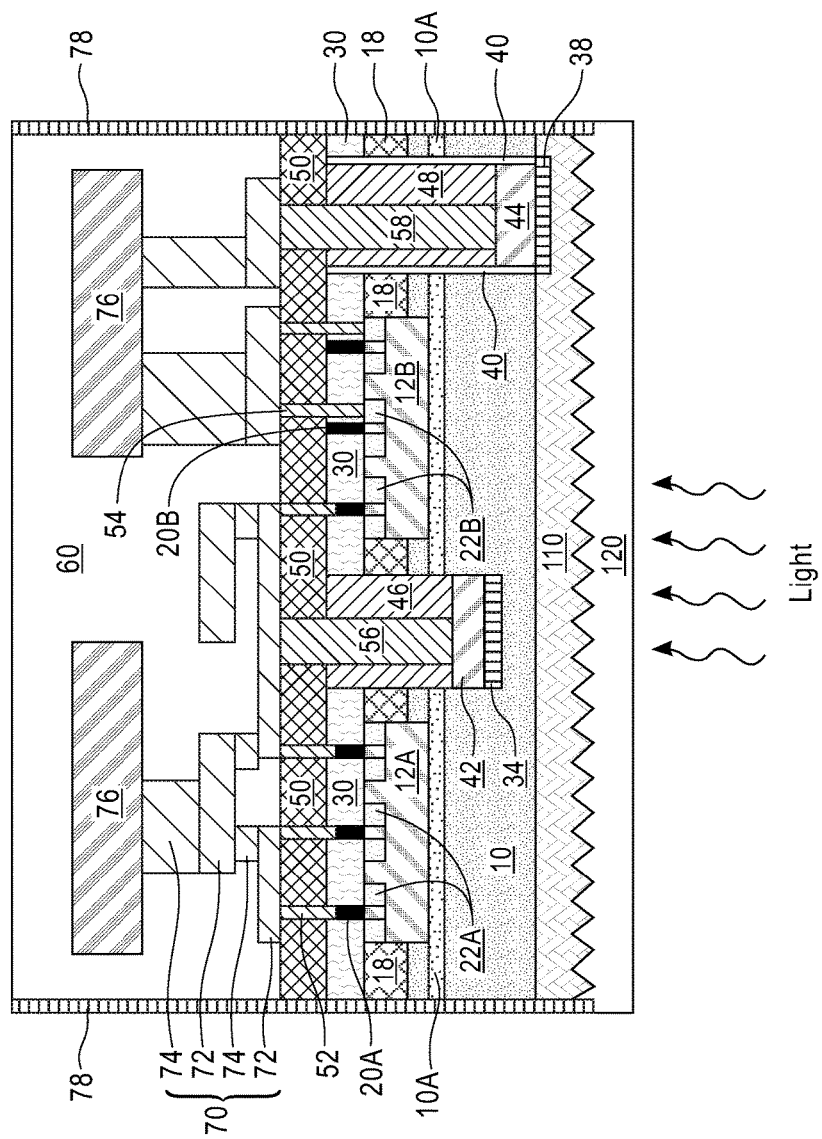
FIG. 9 is a vertical cross-sectional view of the exemplary semiconductor structure after removing the carrier substrate and the TCA structure.

Referring to FIG. 9, the structure of FIG. 8 is flipped over and the carrier substrate 80 is removed, for example, by cleaving, dissolving or ashing the TCA structure 90. The structure of FIG. 9 can then be diced or etched along the guard ring 78 to form singulated semiconductor chips.

In the present application, by forming a doped semiconductor layer 110 on a backside of a semiconductor substrate 10, a p-n junction for a photovoltaic cell is thus formed on the backside of each semiconductor chip. The photovoltaic cell is connected to FETs that are formed in a front side of the same chip using TDV structures 56, 58. In operation, photos of light incident on the doped semiconductor layer 110 generate a voltage across the p-n junction formed between a bottom portion of the semiconductor substrate 10 and the doped semiconductor layer 110, which acts as a power source for the FETs. In the present application, by forming the photovoltaic cell on the backside of the chip, the photovoltaic cell does not consume valuable chip real estate.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
at least one transistor located in a front side of a semiconductor substrate of a first conductivity type, wherein the at least one transistor is laterally surrounded by an interlevel dielectric (ILD) layer located over a topmost surface of the semiconductor substrate;
a doped semiconductor layer of a second conductivity type that is opposite to the first conductivity type located on a backside of the semiconductor substrate, wherein a p-n junction is formed between the doped semiconductor layer and the semiconductor substrate;
a first stack comprising, from bottom to top, a first contact structure and a first dielectric cap located within a first trench that extends through the ILD layer and partially into the semiconductor substrate; and
a second stack comprising, for bottom to top, a second contact structure and a second dielectric cap located within a second trench that extends through the ILD layer and the semiconductor substrate.

2. The semiconductor structure of claim 1, wherein the semiconductor substrate comprises p-type dopants, and the doped semiconductor layer comprises n-type dopants.

3. The semiconductor structure of claim 1, a dopant concentration in the semiconductor substrate is less than $1\times10^{16}$ atoms/cm$^3$, and a dopant concentration in the doped semiconductor layer 110 is from $1\times10^{16}$ atoms/cm$^3$ to $1\times10^{19}$ atoms/cm$^3$.

4. The semiconductor structure of claim 1, further comprising a first heavily doped region of the first conductivity type located within the semiconductor substrate and directly underneath the first contact structure.

5. The semiconductor structure of claim 4, further comprising a second heavily doped region of the second conductivity located within the doped semiconductor layer and directly underneath the second contact structure.

6. The semiconductor structure of claim 5, wherein each of the first heavily doped region and the second heavily doped region has a dopant concentration greater than $1\times10^{19}$ atoms/cm$^3$.

7. The semiconductor structure of claim 1, further comprising a dielectric liner located on sidewalls of the second trench, wherein the dielectric liner laterally surrounds the second stack of the second contact structure and the second dielectric cap.

8. The semiconductor structure of claim 1, further comprising a first through-dielectric via (TDV) structure extending through the first dielectric cap and contacting the first contact structure, and a second TDV structure extending through the second dielectric cap and contacting the second contact structure.

9. The semiconductor structure of claim 1, wherein the at least one transistor comprises a gate electrode on the semiconductor substrate and source/drain regions located in the semiconductor substrate on opposite sides of the gate structure, wherein the ILD layer laterally surrounds the gate structure.

10. The semiconductor structure of claim 9, further comprising a gate contact structure contacting a gate electrode in the gate structure and a source/drain contact structure contacting one of the source/drain regions.

\* \* \* \* \*